(12) United States Patent
Takahashi

(10) Patent No.: US 7,879,180 B2
(45) Date of Patent: Feb. 1, 2011

(54) POLISHING DEVICE AND POLISHING METHOD

(75) Inventor: Yuto Takahashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 356 days.

(21) Appl. No.: 11/447,254

(22) Filed: Jun. 6, 2006

(65) Prior Publication Data
US 2007/0199923 A1    Aug. 30, 2007

(30) Foreign Application Priority Data
Feb. 24, 2006    (JP)    ............... 2006-047918

(51) Int. Cl.
*C03C 15/00*    (2006.01)
*H01L 21/306*    (2006.01)

(52) U.S. Cl. .................................. 156/345.12; 216/88

(58) Field of Classification Search ............ 156/345.12; 134/902; 451/50, 9, 108, 150, 162, 119, 451/351, 356, 421, 426; 216/88
See application file for complete search history.

(56) References Cited

U.S. PATENT DOCUMENTS

| | | | |
|---|---|---|---|
| 4,999,954 A * | 3/1991 | Miyamoto et al. ............. | 451/5 |
| 5,351,360 A * | 10/1994 | Suzuki et al. ................. | 15/302 |
| 5,639,311 A * | 6/1997 | Holley et al. .................... | 134/6 |
| 6,055,694 A * | 5/2000 | Steere ............................ | 15/77 |
| 6,818,095 B1 * | 11/2004 | Kim ........................ | 156/345.12 |
| 6,997,791 B2 * | 2/2006 | Lee ............................. | 451/287 |
| 7,004,823 B2 * | 2/2006 | Kisboll et al. ................. | 451/57 |
| 2007/0199923 A1 * | 8/2007 | Takahashi ..................... | 216/88 |

FOREIGN PATENT DOCUMENTS

| | | |
|---|---|---|
| JP | 2000-49122 A | 2/2000 |
| JP | 2003-109919 A | 4/2003 |

OTHER PUBLICATIONS

Machine Generated English Translation of JP2003109919A, published Apr. 11, 2003.*

* cited by examiner

*Primary Examiner*—Sylvia R. MacArthur
(74) *Attorney, Agent, or Firm*—Fujitsu Patent Center

(57) ABSTRACT

Disclosed are a polishing device and polishing method for forming a wafer with high flatness using a CMP process. For the polishing of the wafer, a polishing device including a chuck section and a polishing member having a needle member is used. In the polishing, the wafer is fixed on the chuck section and then, a working fluid containing no abrasive grains is supplied to a wafer surface as well as the needle member is pressed against the wafer surface and is caused to rapidly vibrate. By doing so, the needle member tip is caused to vibrate to rub the wafer surface, thereby performing the polishing. As a result, dishings due to asperities on the wafer surface or scratches extending over a wide range are prevented from occurring, so that the wafer with high flatness can be obtained.

16 Claims, 17 Drawing Sheets

POLISHING DEVICE AND POLISHING METHOD

CROSS-REFERENCE TO RELATED APPLICATIONS

This application is based upon and claims the benefits of priority from the prior Japanese Patent Application No. 2006-047918 filed on Feb. 24, 2006, the entire contents of which are incorporated herein by reference.

BACKGROUND OF THE INVENTION

1. Field of the Invention

The present invention relates to a polishing device and a polishing method. More particularly, the present invention relates to a polishing device and polishing method for flattening a wafer surface using a CMP (Chemical Mechanical Polishing) process.

2. Description of the Related Art

Conventionally, a process for flattening a wafer surface after predetermined film formation is essential in the manufacture of a semiconductor device. The reason is that when asperities occur on a wafer surface, the following problems may occur. That is, a coating property of a subsequently formed film deteriorates and therefore, breaking of wire or insulation failure is caused, or a coating film thickness of resist changes in a lithography step or a lens is put into an unfocused condition during exposure and therefore, it becomes difficult to form a micropattern. At present, the CMP process for performing polishing by pressing a wafer against a surface of a polishing pad and rotating the wafer and the pad while supplying a working fluid containing abrasive grains is widely used in the flatness of a wafer surface.

For the CMP process, for example, the following methods are heretofore proposed. One method is such that in order to suppress a scratch which may occur in rubbing both surfaces of a wafer and a polishing pad to perform the polishing as described above, a polishing pad which contains impurities in a concentration of a fixed value or less and which is harder than the wafer is used or a needle-shaped abrasive grain is used (see, e.g., Japanese Unexamined Patent Application Publication No. 2000-49122). Another method is such that using a polyvinyl-chloride brush with a predetermined shape in place of an ordinary polishing pad, polishing of a wafer surface is performed by rotating the brush while supplying a working fluid and then, water or drug solution is supplied to the wafer surface after the polishing to clean the surface using the brush, if necessary (see, e.g., Japanese Unexamined Patent Application Publication No. 2003-109919).

However, a conventionally used polishing pad is formed of a material having elasticity, such as urethane. In a case of using such a polishing pad in polishing of a wafer, when the wafer is pressed against the polishing pad, the polishing pad follows asperities on a wafer surface. As a result, steps remain on the wafer surface even after the polishing so that the wafer surface may fail to obtain sufficient flatness.

FIG. 15 illustrates a conventional polishing method.

When a surface of a wafer 100 as shown in FIG. 15 is polished using a polishing pad 101 having elasticity, a working fluid containing abrasive grains 102 is flowed between the wafer 100 and the polishing pad 101 as well as the wafer 100 is pressed against the polishing pad 101. On this occasion, each of the wafer 100 and the pad 101 is rotated.

At this time, assume that the wafer 100 has a structure that on a surface of an insulating film 103a having formed thereon wirings 104a and 104b, an insulating film 103b is further deposited. In this case, asperities of the insulating film 103b in response to pattern shapes of the wirings 104a and 104b are formed on the wafer 100 surface. When the wafer 100 with such a surface shape is pressed against the polishing pad 101, the polishing pad 101 follows the asperities on the wafer 100 surface for the sake of the elasticity thereof. Therefore, during the polishing, the convex portions on the wafer 100 surface are polished as well as the concave portions thereon are polished. As a result, steps remain on the wafer 100 surface even after the polishing.

FIGS. 16 and 17 show examples of wafer shapes after polishing.

When the polishing pad follows asperities as described above, the following problems occur. For example, when a wiring 201a, and wirings 201b and 201c are present at a certain distance within a wafer 200 as shown in FIG. 16, dishings may occur therebetween. Further, when the wafer 300 has in the inside thereof an area where wirings 301a, 301b, 301c, 301d, 301e and 301f are thickly present as shown in FIG. 17, global steps may occur on each side of the area.

Further, in the polishing of a wafer surface using a polishing pad, the polishing pad and the wafer are rotated and the surfaces thereof are rubbed. Therefore, when relatively large foreign objects (abrasive grains contained in a working fluid or residues produced by polishing) are mixed between the polishing pad and the wafer during the polishing, a large scratch, that is, a scratch extending over a number of chip areas on the wafer easily occurs.

By changing the polishing pad into a harder one, the dishings or the global steps can be somewhat reduced in occurrence. However, even in the case of thus changing the polishing pad into the harder one, it is difficult to prevent the scratch from occurring as long as the polishing is performed by rubbing the surfaces. On the contrary, a widespread scratch may occur deeply by changing the polishing pad into the harder one.

SUMMARY OF THE INVENTION

In view of the foregoing, it is an object of the present invention to provide a polishing device and polishing method capable of ensuring high flatness.

To accomplish the above object, according to the present invention, there is provided a polishing device for polishing a workpiece surface. This polishing device comprises:

a polishing member having a needle member, wherein polishing of the workpiece surface is performed by bringing the needle member into contact with the workpiece surface and causing the needle member to vibrate.

To accomplish another object, according to the present invention, there is provided a polishing method for polishing a workpiece surface. This polishing method comprises:

polishing, using a polishing member having a needle member, the workpiece surface by bringing the needle member into contact with the workpiece surface and causing the needle member to vibrate.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
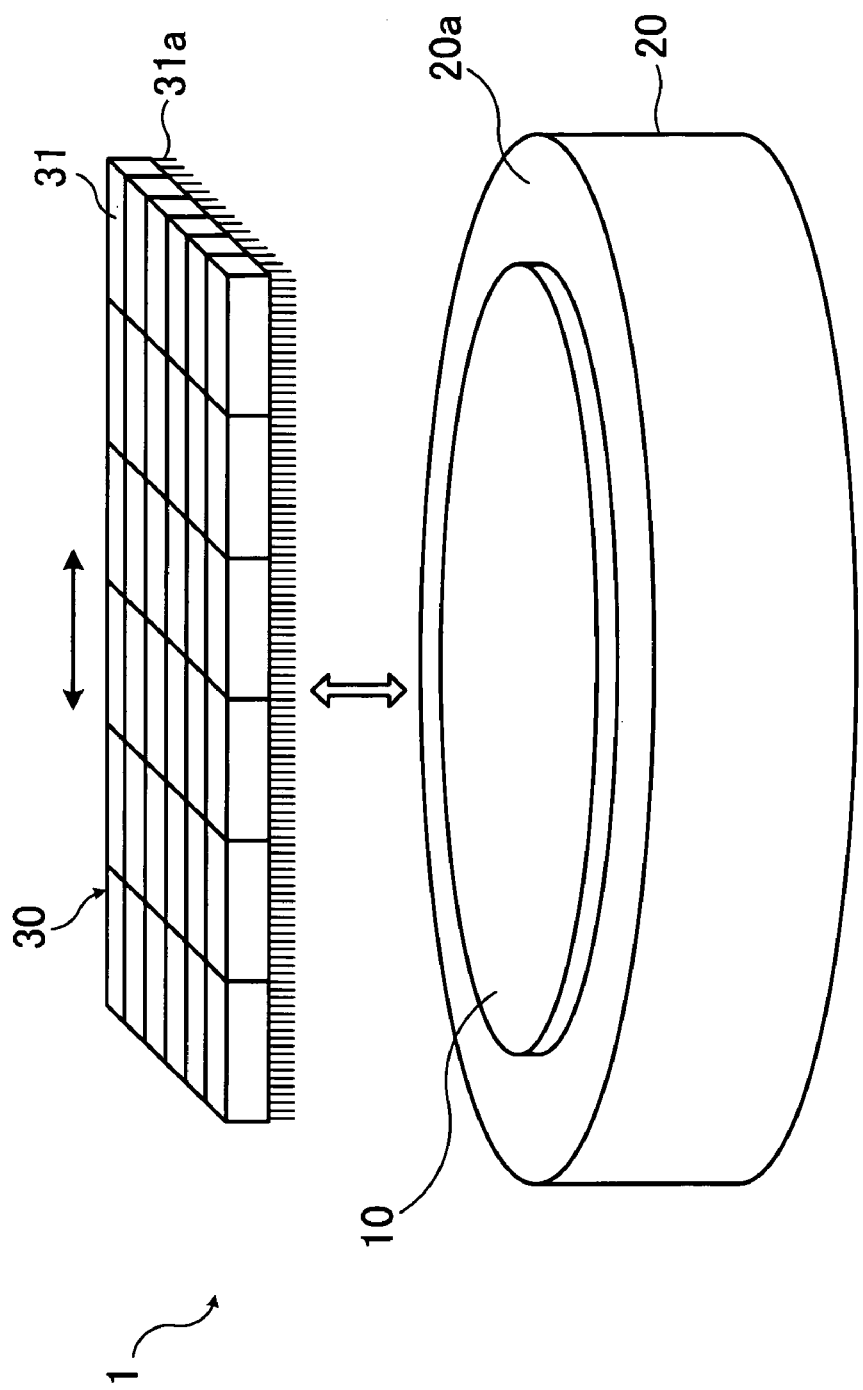
FIG. 1 is a schematic outline view of a polishing device.

Taking as an example a case of flattening a wafer surface, preferred embodiments of the present invention will be described in detail below with reference to the accompanying drawings, wherein like reference numerals refer to like elements throughout.

FIG. 1 is a schematic outline view of a polishing device. Further, FIGS. 2 to 4 are schematic outline views of a polishing member of a polishing device, FIG. 2 is a schematic elevational view of a polishing member, FIG. 3 is a schematic plan view of a polishing member and FIG. 4 is a schematic bottom view of a polishing member.

A polishing device 1 shown in FIG. 1 has a chuck section 20 for holding a wafer 10 as a member to be polished (workpiece), and a polishing member 30 for polishing the wafer 10. In the polishing device 1, the polishing member 30 is constructed so as to be separated from and brought into contact with the wafer 10. Further, the polishing member 30 is constructed so as to rapidly vibrate in the direction parallel to a mounting surface 20a of the chuck section 20. An operation-control mechanism of the polishing member 30 in the polishing device 1 will be described later. In FIG. 1, the operation-control mechanism of the polishing member 30 is not shown.

The polishing member 30 of the polishing device 1 with the above-described structure has a block 31 having held therein a plurality of ultrasmall and ultrafine needle members 31a, as shown in FIG. 1 and FIGS. 2 to 4. Further, the polishing member 30 is constructed by connecting a plurality of the blocks 31. In addition, each of the blocks 31 has a working fluid supplying port 31b for supplying a working fluid to the needle member 31a side during the polishing. The working fluid supplying port 31b is connected to a working fluid flow pipe or a storage tank (the both are not shown), which is installed at the outside of the polishing member 30. From the working fluid supplying port 31b, the working fluid is supplied to the needle member 31a side, if necessary.

Figure 2:
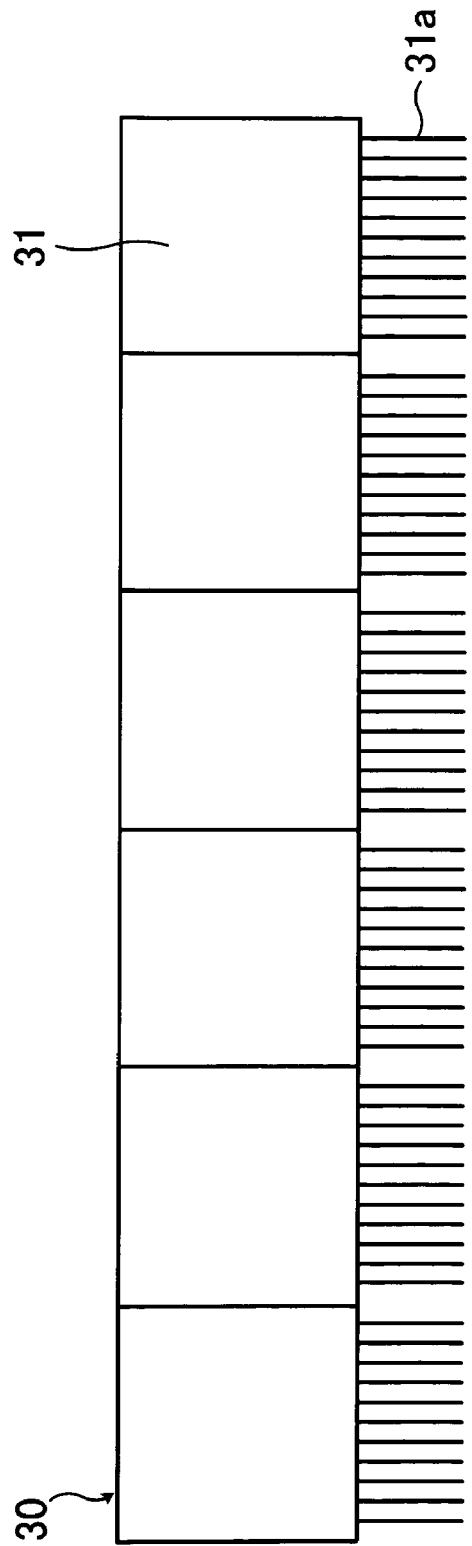
FIG. 2 is a schematic elevational view of a polishing member.
Figure 3:
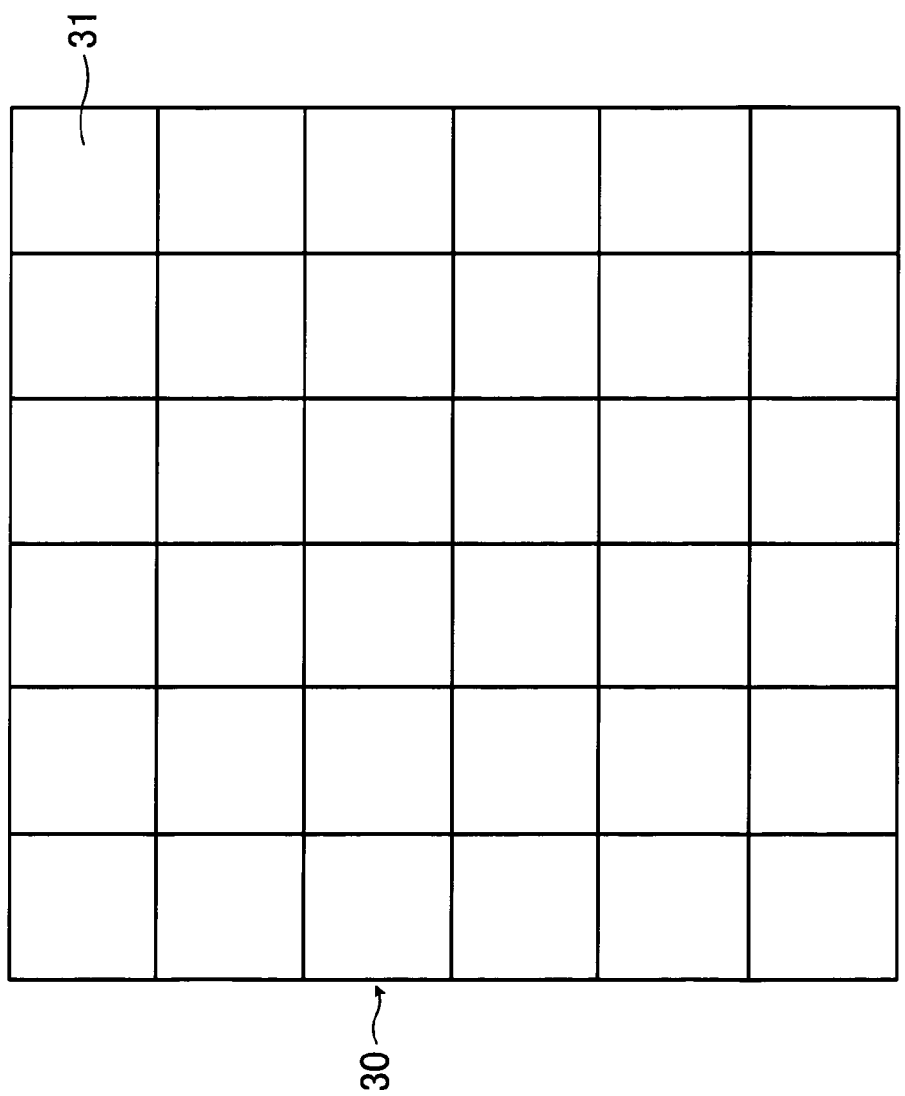
FIG. 3 is a schematic plan view of a polishing member.
Figure 4:
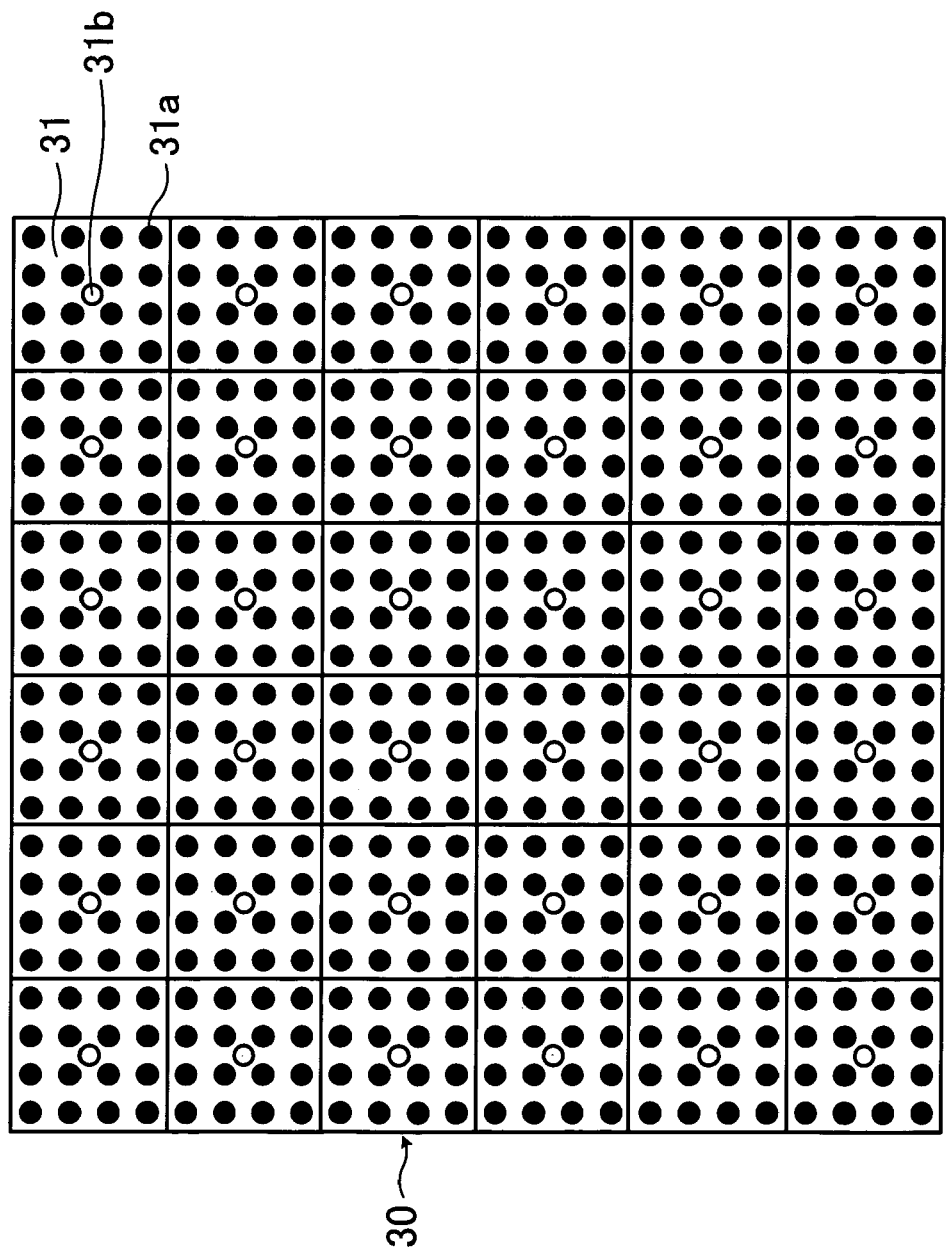
FIG. 4 is a schematic bottom view of a polishing member.

The number of the needle members 31a is not limited to that shown in FIGS. 1, 2 and 4. Further, the number or size of the needle members 31a in each figure is changed for the sake of convenience.

Herein, the needle member 31a of the block 31 is made of ultrasmall and ultrafine needle materials of micron level. As described later, the polishing member 30 performs polishing by pressing this needle member 31a against the wafer 10. Therefore, the needle member 31a must be ultrasmall and ultrafine as well as must have a mechanical strength of a constant level or more. Examples of the material which satisfies such requirements include a carbon nanotube.

The block 31 is not particularly limited in materials thereof as long as the block 31 can surely hold the needle member 31a from before polishing to after polishing and at the same time, has such a hardness that in a state of being a simple substance, the block 31 is prevented from following the asperities of the wafer 10 surface when the needle member 31a is pressed against the wafer 10 during polishing. In a case of using the above-described carbon nanotube as the needle member 31a, a carbon nanotube with a predetermined length is grown up on one surface of the block 31 to allow the block 31 to hold a number of the ultrasmall and ultrafine needle members 31a.

The working fluid supplying port 31b is herein provided such that a working fluid is supplied from an almost central part of the block 31 to the needle member 31a side. During polishing, almost the same amount of a working fluid is separately supplied from the working fluid supplying port 31b of each of the blocks 31. A type of the working fluid is selected in response to a material of the wafer 10 surface to be polished. For example, an acid solution such as a hydrogen peroxide solution, or an alkaline solution such as potassium hydroxide is used. Note, however, that in the polishing using this polishing member 30, although a working fluid containing abrasive grains such as silica particles can also be used, a working fluid containing no such abrasive grains is herein used.

By connecting a plurality of the respective blocks 31 with such a structure, the polishing member 30 as shown in FIGS. 1 to 4 is constructed. A size of the polishing member 30 is set in response to that of the wafer 10. The size thereof is preferably set to a size such that in performing polishing of the wafer 10, when the polishing member 30 and the wafer 10 are disposed facing to each other as shown in FIG. 1, the whole wafer 10 is covered by the polishing member 30. The size of the polishing member 30 can be adjusted, for example, by the number of the connected blocks 31 or the size of each of the blocks 31.

Figure 5:
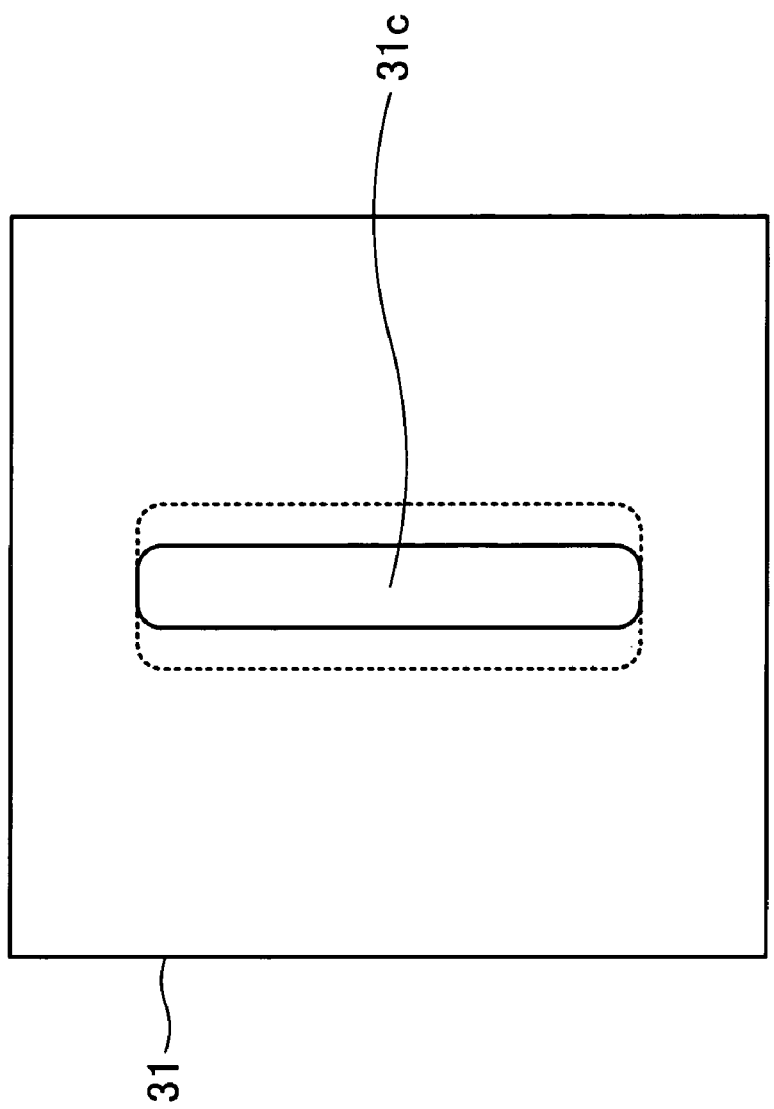
FIG. 5 is a schematic view of a connected surface of blocks.
Figure 6:
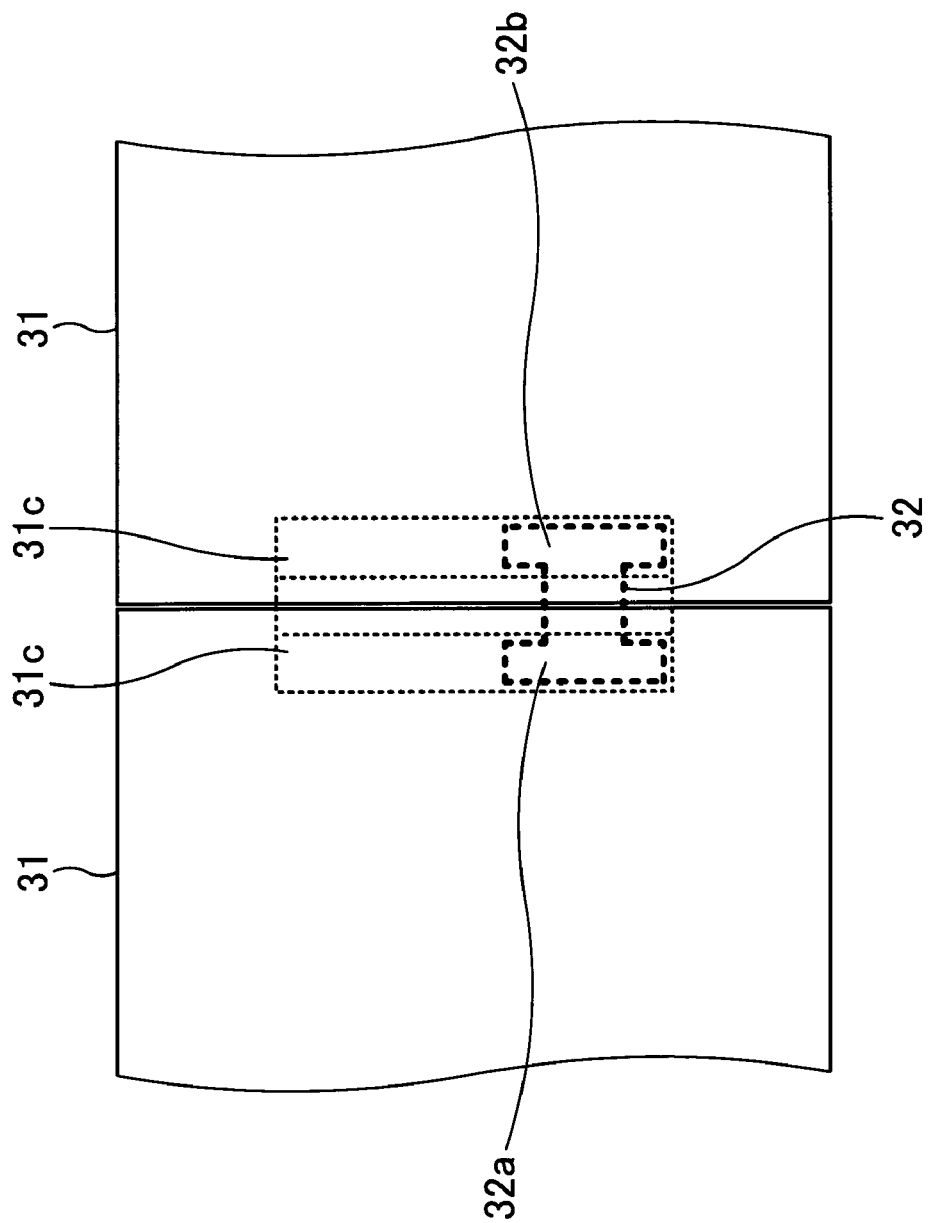
FIG. 6 is a schematic view showing an essential part of a connected state of blocks.

Herein, FIGS. 5 and 6 illustrate an outline of one example of a block connecting method, FIG. 5 is a schematic view of a connected surface of the blocks and FIG. 6 is a schematic view showing an essential part of a connected state of the blocks.

As shown in FIG. 5, a groove 31c having a T-shaped cross section, which is wide in the inside and narrow in the surface, is formed in the connected surface of the respective blocks 31. Further, as shown in FIG. 6, the grooves 31c of the respective blocks 31 are allowed to face to each other and the respective grooves 31c are connected using a connecting member 32. The connecting member 32 has a structure that due to a shape of the member 32 and a cross sectional shape of the groove 31c, both ends 32a and 32b of the member 32 are prevented from going off the respective grooves 31c after completion of the connection. Further, the member 32 is constructed so as to move within the groove 31c along the shape of the groove 31c.

Figure 7:
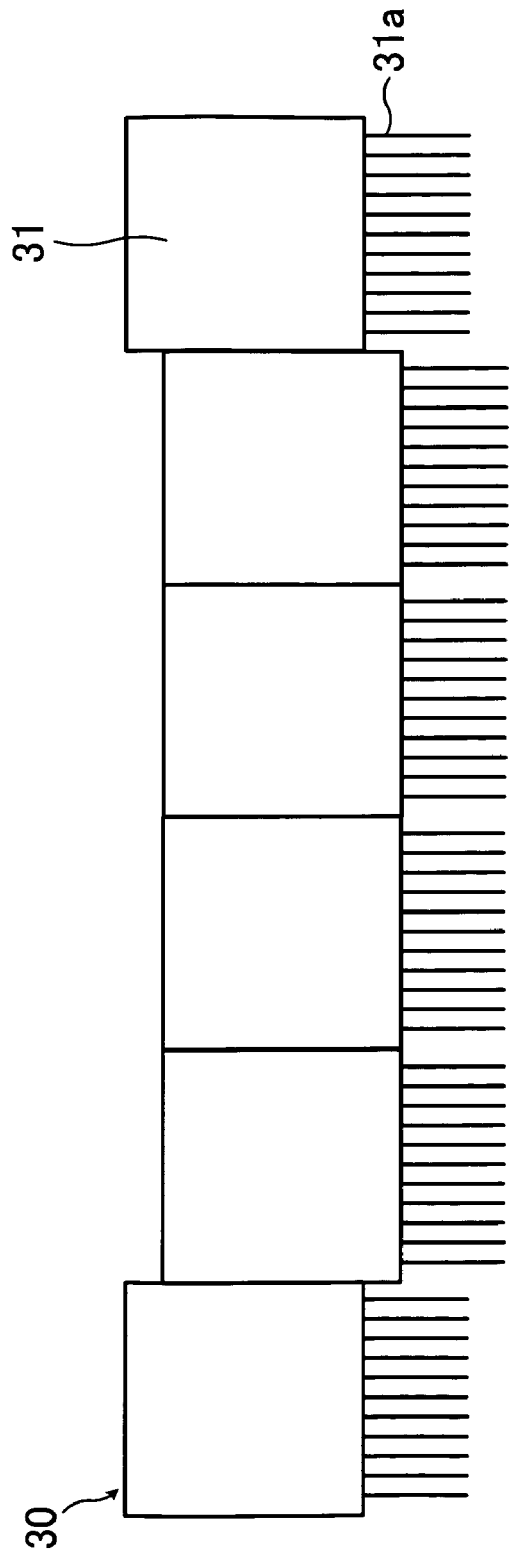
FIG. 7 is a schematic elevational view showing one example of a state of a polishing member during polishing.

FIG. 7 is a schematic elevational view showing one example of a state of a polishing member during polishing.

When a connected section of the respective blocks 31 is formed to have a structure as shown in FIGS. 5 and 6, a position of the block 31 in the polishing member 30 can be changed in each of the blocks 31 in a state where the blocks 31 are connected, for example, as shown in FIG. 7. Accordingly, for example, a position of the polishing member 30 in the direction being separated from and brought into contact with the surface of the wafer 10 held by the chuck section 20 can be suitably adjusted in response to an arrangement of a wafer 10 surface area which requires polishing and the other areas which requires no polishing, or in response to an arrangement or level of asperities on the wafer 10 surface.

Next, the operation-control mechanism of the polishing member 30 will be described.

Figure 8:
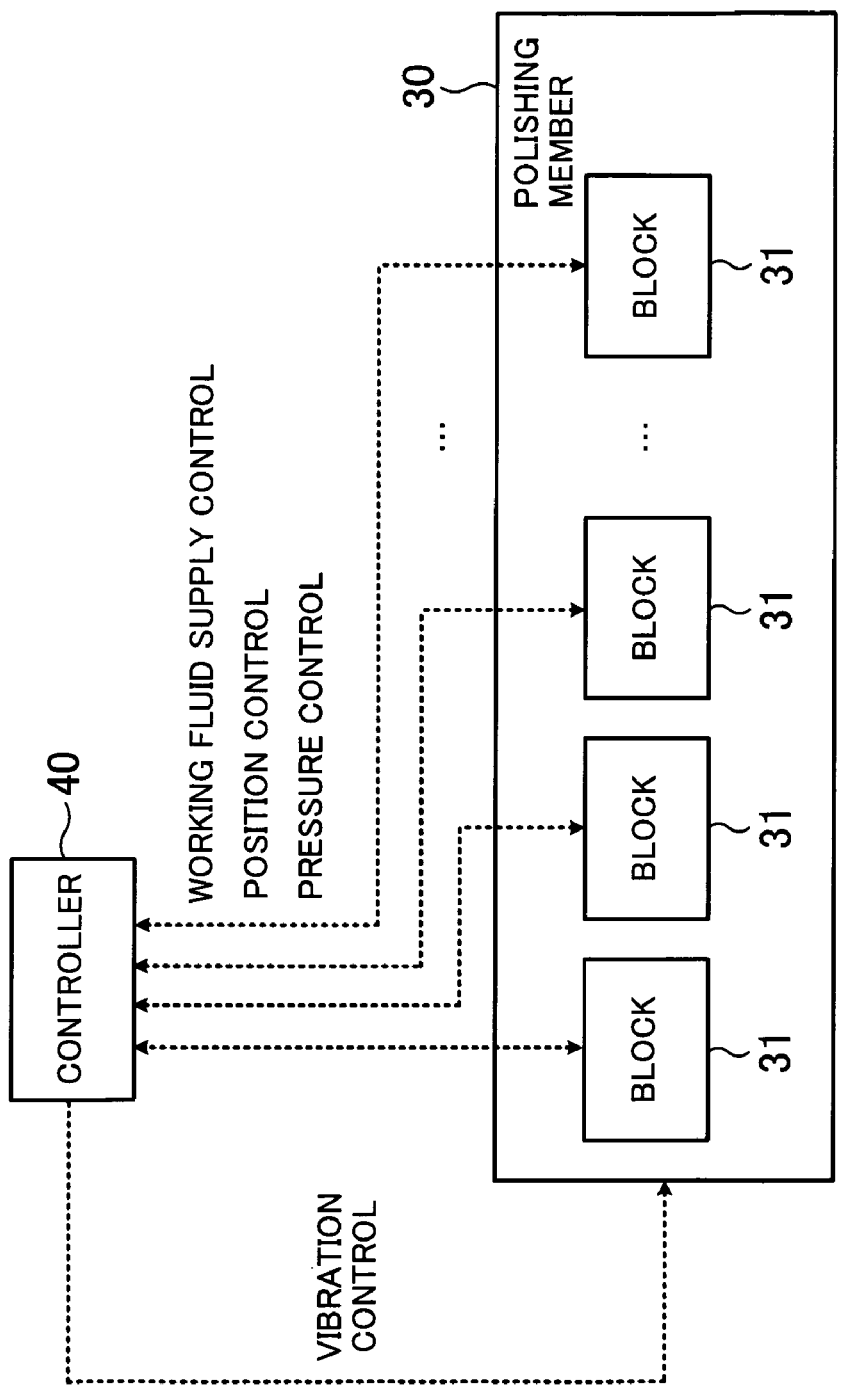
FIG. 8 shows a configuration example of an operation-control mechanism of a polishing member.

FIG. 8 shows a configuration example of the operation-control mechanism of the polishing member.

Each of the blocks 31 of the polishing member 30 is connected to a controller 40. The polishing member 30 is constructed such that the supply of the working fluid from the working fluid supplying port 31b, the position of each of the blocks 31 in the direction being separated from and brought into contact with the wafer 10 surface, and the pressing force of each of the blocks 31 against the wafer 10 surface are each controlled by this controller 40. For example, the controller 40 performs control such that in order to finally obtain the wafer 10 with high flatness, the positions of the respective blocks 31 in the direction being separated from and brought into contact with the wafer 10 surface are allowed to coincide with each other on completion of the polishing, or the pressing forces of the respective blocks 31 against the wafer 10 surface or stresses caused in pressing the wafer 10 surface at a fixed pressure are allowed to coincide with each other on completion of the polishing. For that purpose, during polishing, the controller 40 performs position control or pressure control of each of the blocks 31 while performing working fluid supply control.

Further, in addition to the pressure control over the respective blocks 31 described above, the controller 40 can perform operational control (vibration control) in which at almost the same position without great movement, the member 30 is caused to rapidly vibrate in the surface direction (horizontal direction in the figure) of the wafer 10. Therefore, rapid vibration by the controller 40 is performed in a state where the needle member 31a of the polishing member 30 is pressed against the wafer 10 surface. As a result, the polishing member 30 can perform the polishing by rubbing the wafer 10 surface with tips of the needle members 31a.

Figure 9:
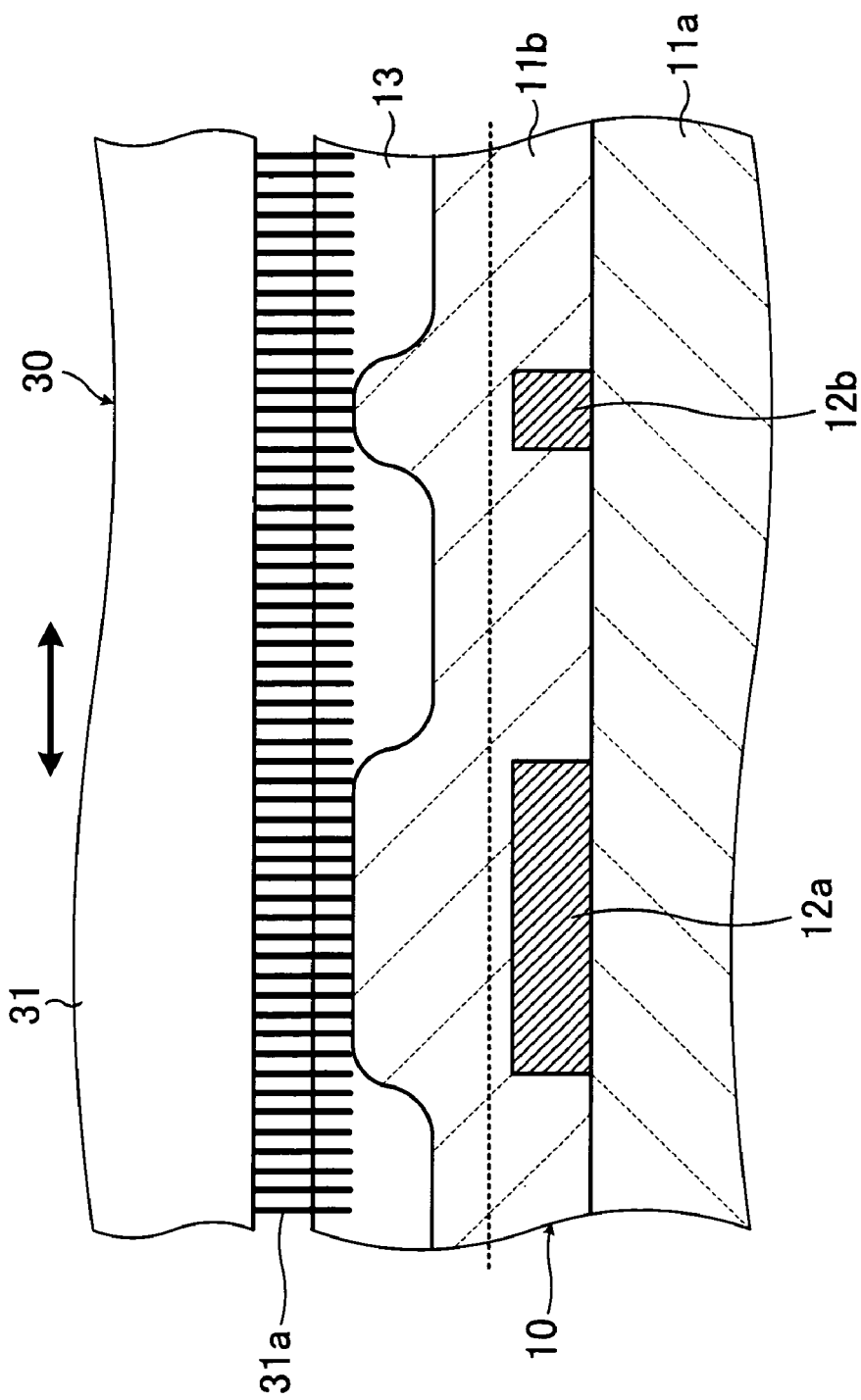
FIG. 9 illustrates an outline of polishing by a polishing member.
Figure 10:
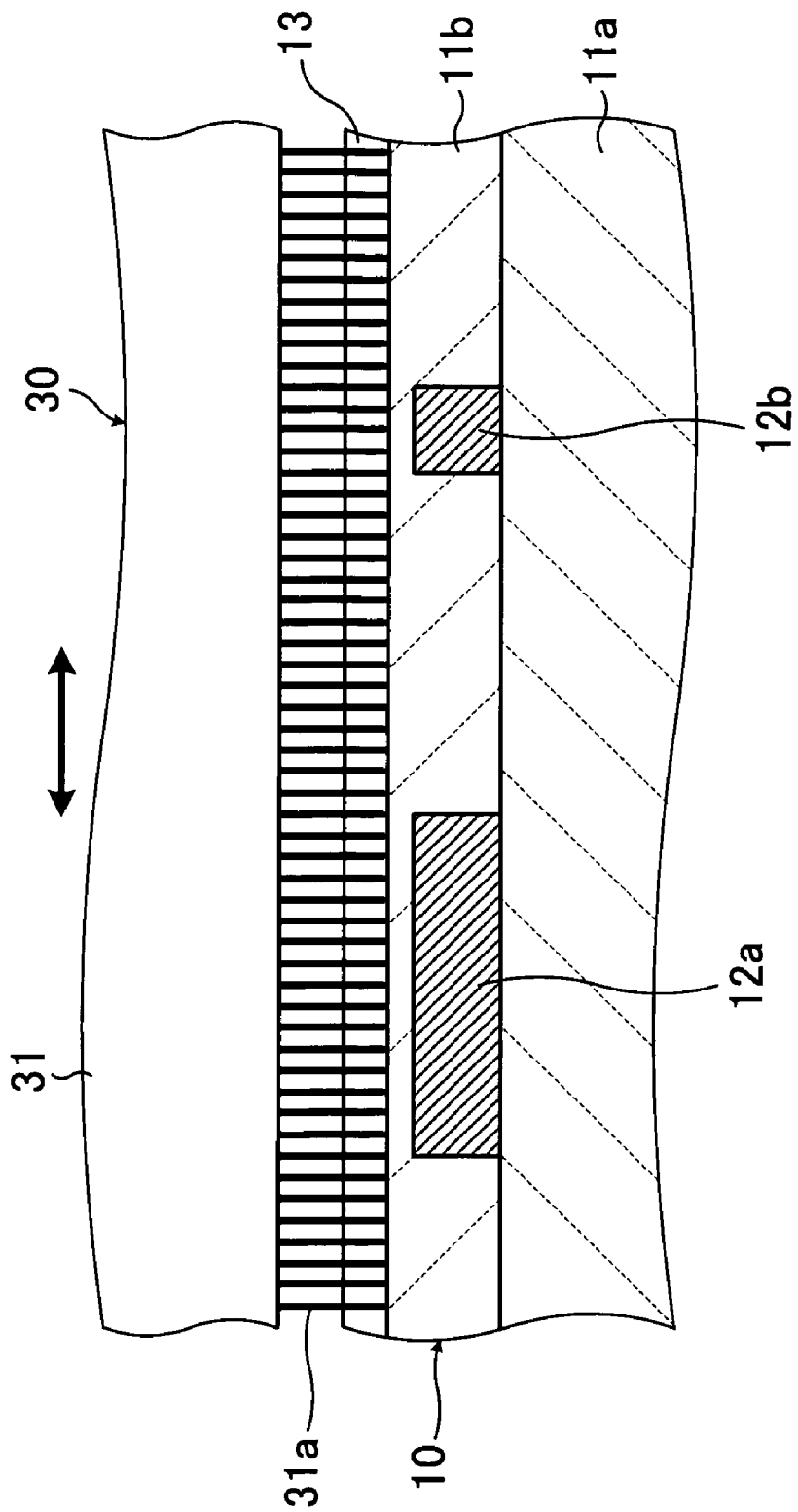
FIG. 10 shows a state after polishing by a polishing member.

FIG. 9 illustrates an outline of the polishing by the polishing member. Further, FIG. 10 shows a state after the polishing by the polishing member. FIGS. 9 and 10 schematically show an area to be polished by one block 31.

Assume that the wafer 10 as a workpiece has such a structure that on a surface of an insulating film 11a having formed thereon wirings 12a and 12b with different pattern shapes, an insulating film 11b is further deposited, as shown in FIG. 9. In this case, asperities of the insulating film 11b are formed on the wafer 10 surface in response to the pattern shapes of the wirings 12a and 12b formed in the inside of the wafer 10.

Polishing of this wafer 10 using the polishing member 30 is performed as follows. First, the wafer 10 is fixed on the chuck section 20 of the polishing device 1 as shown in FIG. 1. Then, the block 31 is pressed against the wafer 10 surface at a suitable pressing force under the controller 40 as shown in FIG. 8. Further, during the polishing, a predetermined working fluid 13 containing no abrasive grains is supplied from the working fluid supplying port 31b to this wafer 10 surface as well as the needle member 31a is pressed against the wafer 10 surface and the polishing member 30 is caused to rapidly vibrate at almost the same position in the surface direction (horizontal direction in the figure) of the wafer 10. On this occasion, the wafer 10 is prevented from rotating. As a result, the wafer 10 surface (insulating film 11b) and the working fluid 13 are chemically reacted as well as the wafer 10 surface is rubbed and polished with the needle member 31a tips. In the wafer 10 surface, a convex portion is selectively polished. Thereafter, the wafer 10 surface having removed therefrom the convex portion is entirely polished up to a set film thickness (a broken line in FIG. 9). Thus, the wafer 10 with high flatness as shown in FIG. 10 is obtained.

Also in areas to be polished by the other blocks 31, the polishing is performed in the same manner as in the above. In the areas which require the polishing, the positions of the respective blocks 31 in the direction being separated from and brought into contact with the wafer 10 surface are allowed to coincide with each other on completion of the polishing, or the pressing forces of the respective blocks 31 against the wafer 10 surface or stress caused in pressing the wafer 10 surface with a fixed pressure are allowed to coincide with each other on completion of the polishing. As a result, a surface with high flatness can be obtained throughout the wafer 10. To the contrary, in a case where an area which requires no polishing is present on the wafer 10, the needle member 31a of the block 31 corresponding to such an area is prevented from being brought into contact with the wafer 10 surface during the polishing of the wafer 10. For that purpose, pressure control over the block 31 may be performed by the controller 40 to adjust a position of the block 31 in the direction being separated from and brought into contact with the wafer 10 surface.

Thus, in the polishing of the wafer 10 using the polishing member 30, the respective blocks 31 are prevented from following asperities on the wafer 10 surface. Therefore, the dishing due to such asperities can be suppressed.

Further, in this polishing, the working fluid 13 containing no abrasive grains is used as well as the needle member 31a tip of the polishing member 30 is pressed against the wafer 10 surface and is caused to rapidly vibrate at almost the same position in the surface direction of the wafer 10. Therefore, as compared with a conventional method for performing polishing by rubbing the surfaces of the polishing pad and the wafer 10, scratches can be effectively prevented from occurring. Even in a case where foreign objects are mixed between the polishing member 30 and the wafer 10 during the polishing, since the wafer 10 is fixed as well as the polishing member 30 is caused to rapidly vibrate at almost the same position, a large scratch extending over a number of chip areas can be prevented from occurring.

Further, in a conventional case of performing the polishing using a polishing pad which follows asperities on the wafer 10 surface, a method for previously forming a thick insulating film 11b in view of the amount of the concave portion polished with the convex portion is frequently adopted. However, in a case of using the above-described polishing member 30 for the polishing of the wafer 10 surface, the convex portion is first polished selectively in the respective block 31 areas. Accordingly, a film thickness of the insulating film 11b previously formed can be more reduced than ever before. Further, also the polished amount itself can be more reduced than ever before. Therefore, the method using the polishing member 30 is advantageous also in terms of cost.

As well as being thus caused due to the pattern shapes of the wirings 12a and 12b, asperities on the wafer 10 surface may be caused due to the film thickness distribution within the wafer 10 surface, which occurs during the film formation of the insulating films 11a and 11b. When the same polishing as described above is performed also on the thus caused asperities, the wafer 10 with high flatness can be of course obtained.

Next, a processing of the polishing member 30 after completion of the polishing will be described.

After completion of the polishing of one or a plurality of the wafers 10, the polishing member 30 used in the polishing of the wafer 10 is subjected to cleaning for removing foreign objects adhered to the polishing member 30, which may cause scratches, or is subjected to flatness setting (zero-point adjustment) of the needle member 31a using a surface table.

Figure 11:
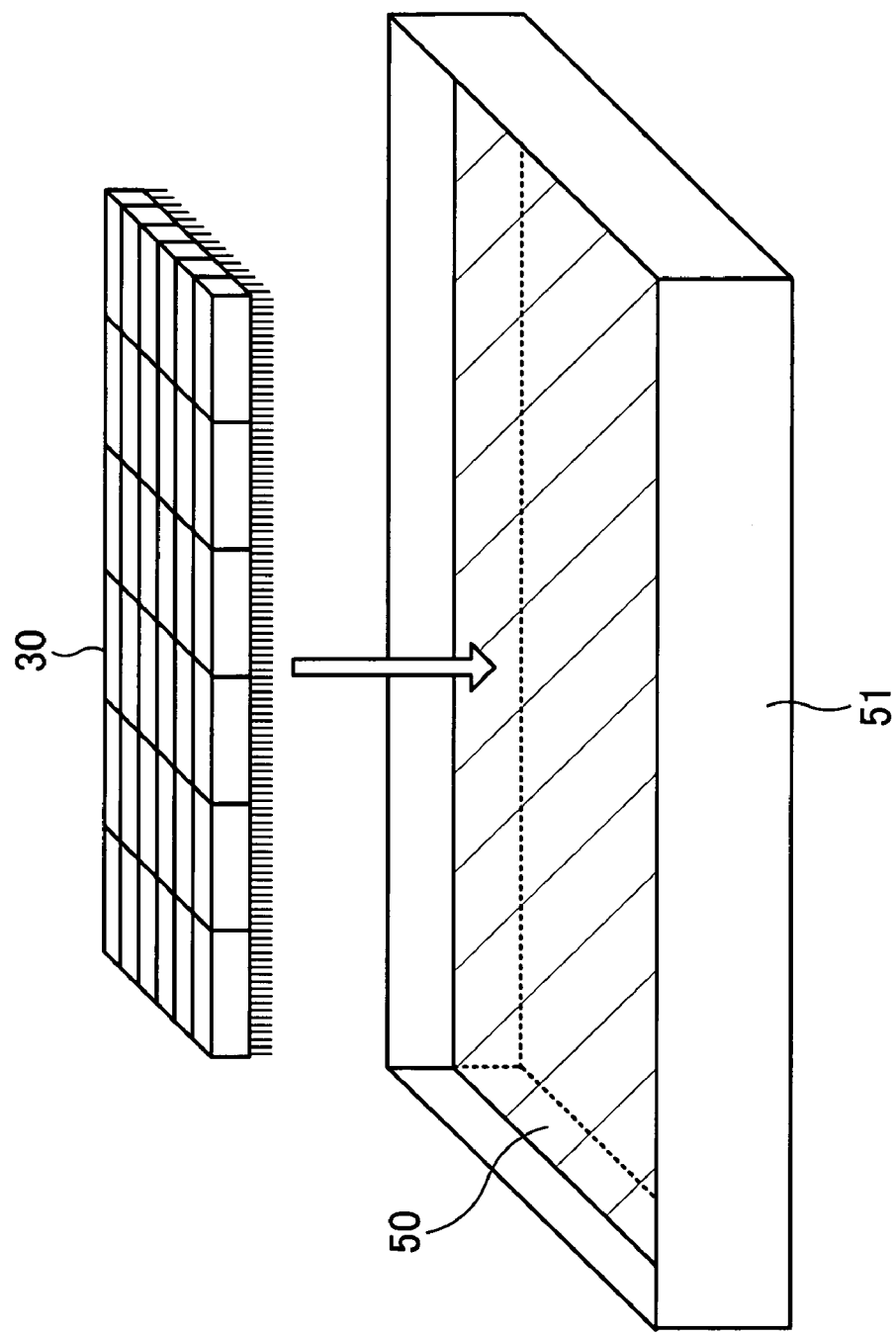
FIG. 11 illustrates an outline of a cleaning method of a polishing member.

FIG. 11 illustrates an outline of a cleaning method of the polishing member.

Prior to performing the cleaning of the polishing member 30, a cleaning tank 51 for storing a predetermined cleaning fluid 50 is first prepared. For the cleaning fluid 50 for the polishing member 30 after completion of the polishing of the wafer 10, for example, purified water or a drug solution such as ammonia can be used.

In the cleaning of the polishing member 30, the polishing member 30 is moved to the cleaning tank 51 and then, the polishing member 30 is dipped into the cleaning fluid 50. In the dipping, at least the needle member 31a of the polishing member 30 is dipped into the cleaning fluid 50. After the dipping, an ultrasonic wave is applied to the cleaning fluid 50 within the cleaning tank 51, or the polishing member 30 is caused to rapidly vibrate as in the polishing. Thus, foreign objects adhered to the needle member 31a are cleaned and removed.

Figure 12:
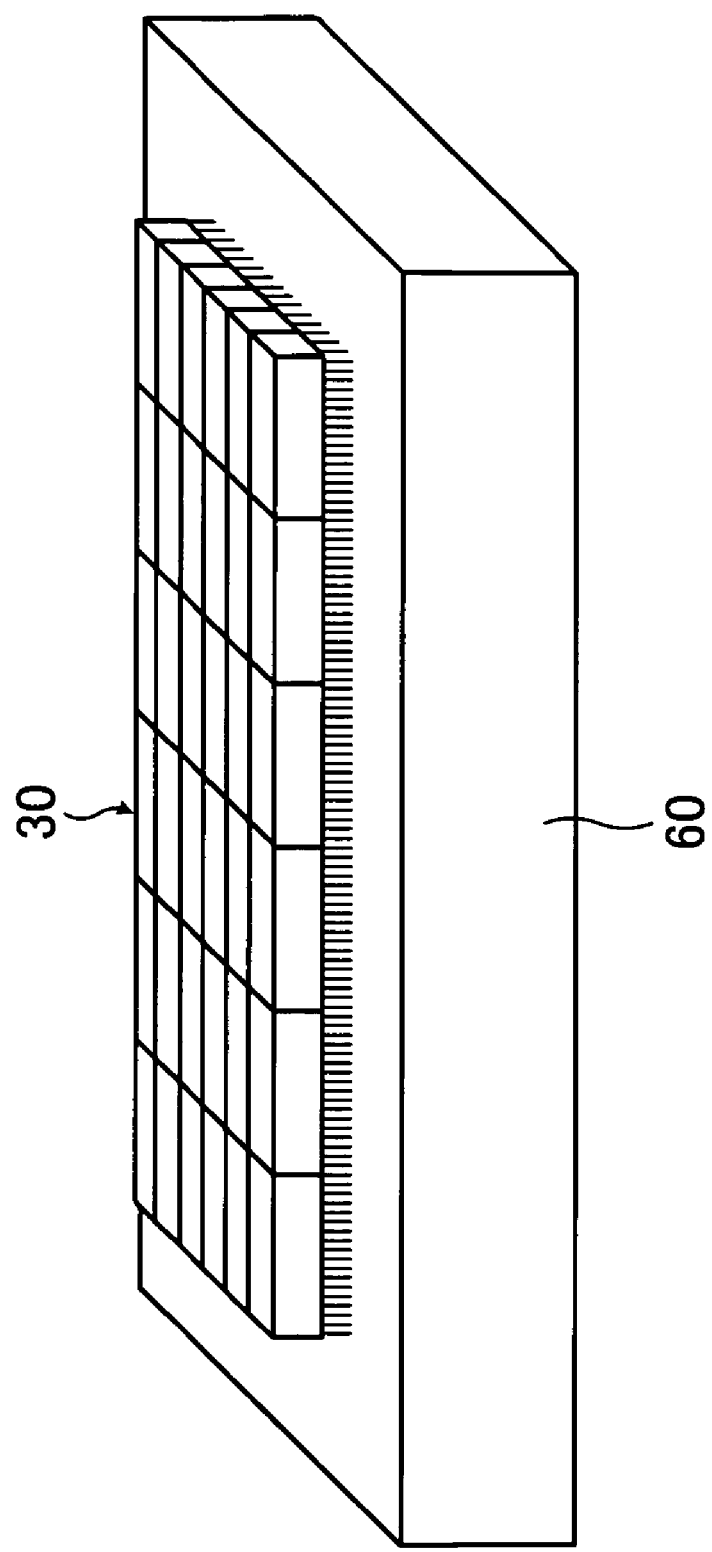
FIG. 12 illustrates an outline of a flatness setting method of a polishing member.

FIG. 12 illustrates an outline of a flatness setting method of the polishing member.

In the polishing member 30 after completion of the polishing of the wafer 10, the needle member 31a may be worn away due to the polishing. The polishing using the polishing member 30 having the needle members 31a partially different in length makes it difficult to flat the wafer 10 with high accuracy. Accordingly, in order to ensure flatness of the needle member 31a, the polishing member 30 is subjected to the flatness setting of the needle member 31a using a flatness setting surface table 60 as shown in FIG. 12.

On this occasion, the polishing member 30 is first placed on the flatness setting surface table 60. Using the controller 40 shown in FIG. 8, a predetermined pressure is evenly applied to each of the blocks 31. On this occasion, positions of all the blocks 31 are lined up and then, the predetermined pressure is evenly applied to each of the blocks 31. When a length of the needle member 31a is unequal among different blocks 31, the magnitude of a stress occurring in applying a predetermined pressure differs among such blocks 31. Therefore, the length of the needle member 31a is equalized by this flatness setting surface table 60 such that the magnitude of the stress is the same in all the blocks 31.

Herein, it is desired that the flatness setting is performed after the polishing member 30 is cleaned by a method as shown in FIG. 11.

When the above-described wafer 10 is polished again using the polishing member 30 thus subjected to the cleaning or the flatness setting, the wafer 10 which is flattened with high accuracy as well as is free from or reduced in damages can be obtained.

In the above description, a case of constructing the needle member 31a of the polishing member 30 using a material such as carbon nanotubes is described by way of example; however, materials other than carbon nanotubes can also be used. In the selection of materials, a resistance against the working fluid 13 used during the polishing or the cleaning fluid 50 used in the cleaning as well as a mechanical strength capable of the polishing of an object surface is taken into consideration.

In addition, in the above description, one working fluid supplying port 31b is provided on each of the blocks 31 of the polishing member 30; however, the number of the ports 31b is not necessarily limited thereto.

Further, a polishing member having another structure may be substituted for the polishing member 30 of the polishing device 1.

Figure 13:
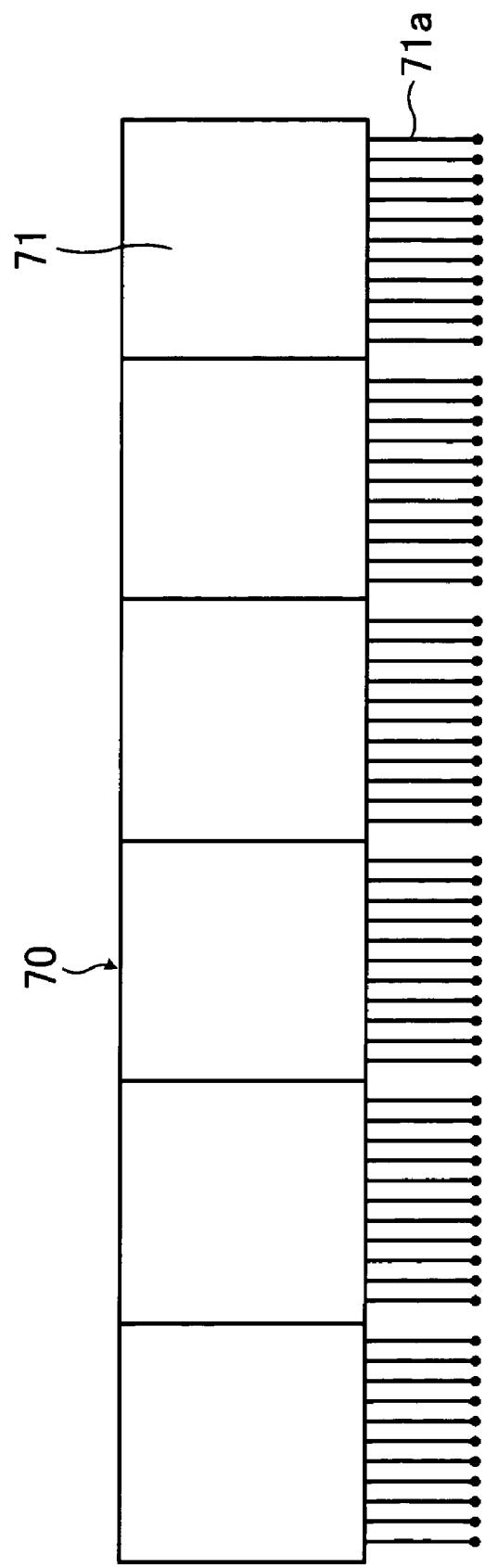
FIG. 13 is a schematic outline view of a first modification example of a polishing member.

FIG. 13 is a schematic outline view of a first modification example of the polishing member.

In the polishing member 70 shown in FIG. 13, a tip of a needle member 71a provided on each of the blocks 71 is formed into a spherical shape. In this respect, the polishing member 70 differs from the polishing member 30. In the case where the tip of the needle member 71a is thus formed into a spherical shape, when the polishing member 70 is caused to rapidly vibrate, the needle member 71a tip smoothly vibrates on the wafer 10 surface. The operational control of this polishing member 70 during the polishing of the wafer 10 can be performed in the same manner as in the case of the polishing member 30. Also by using the polishing member 70 with such a structure, the wafer 10 with high flatness can be obtained in the same manner as in the polishing member 30.

Figure 14:
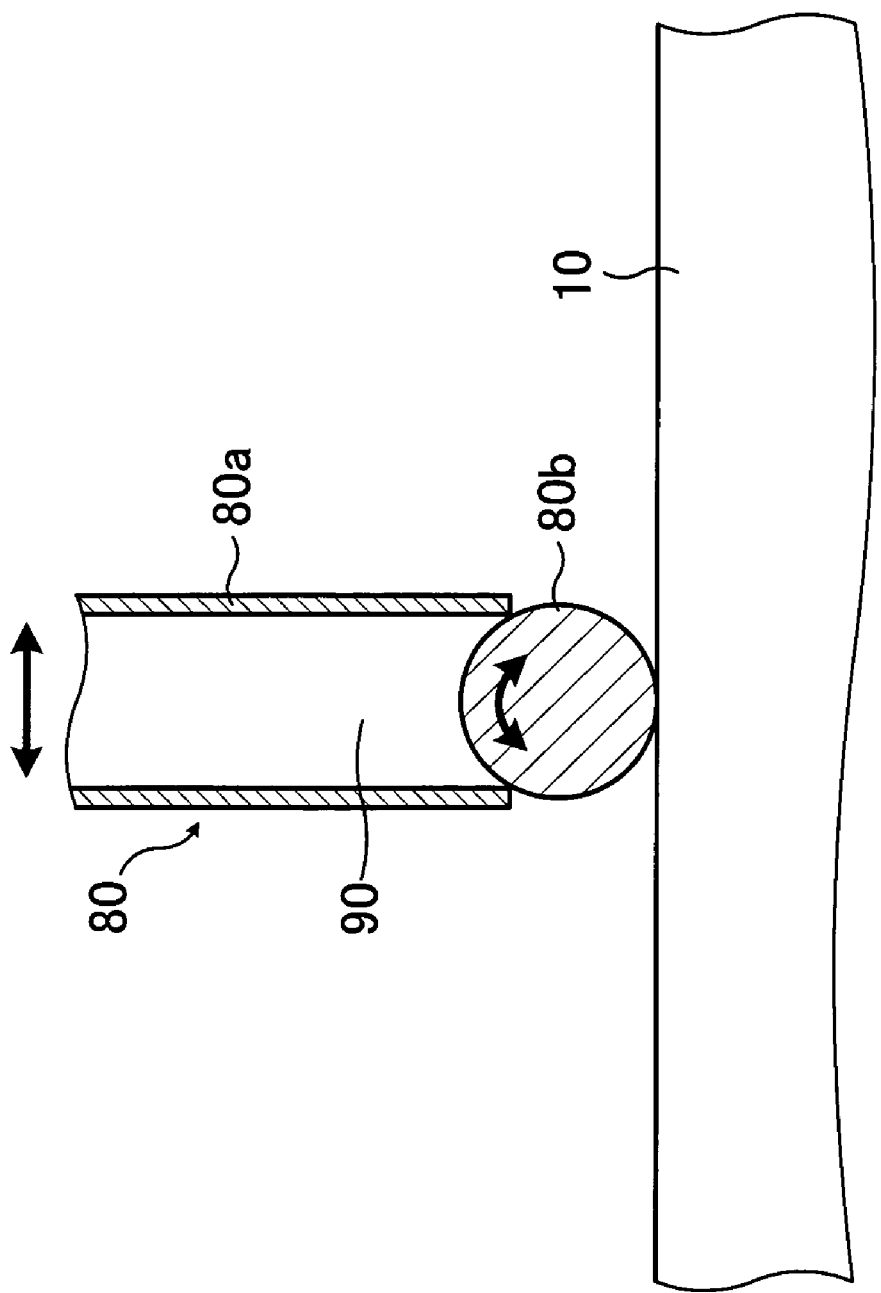
FIG. 14 is a schematic outline view of a second modification example of a polishing member.
Figure 15:
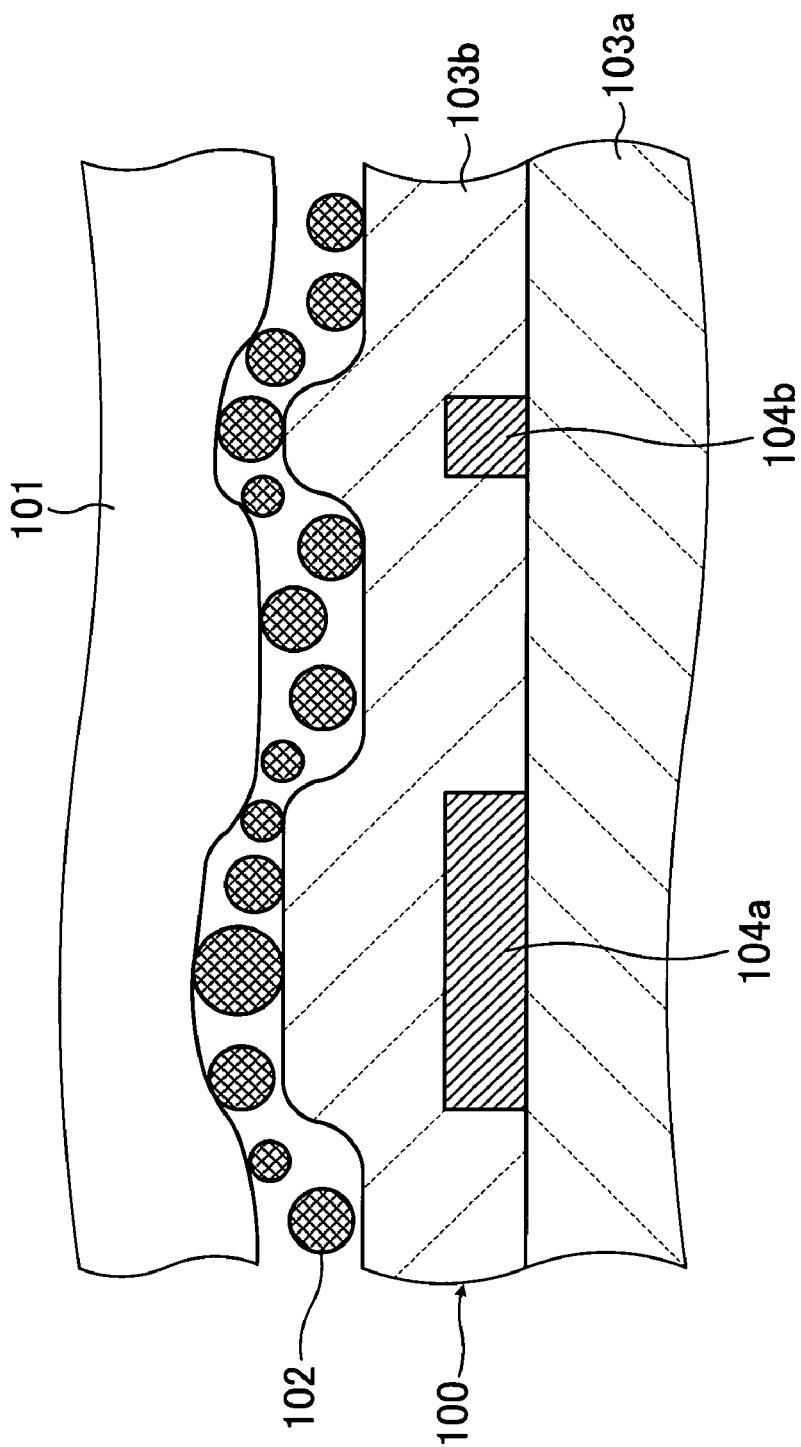
FIG. 15 illustrates a conventional polishing method.
Figure 16:
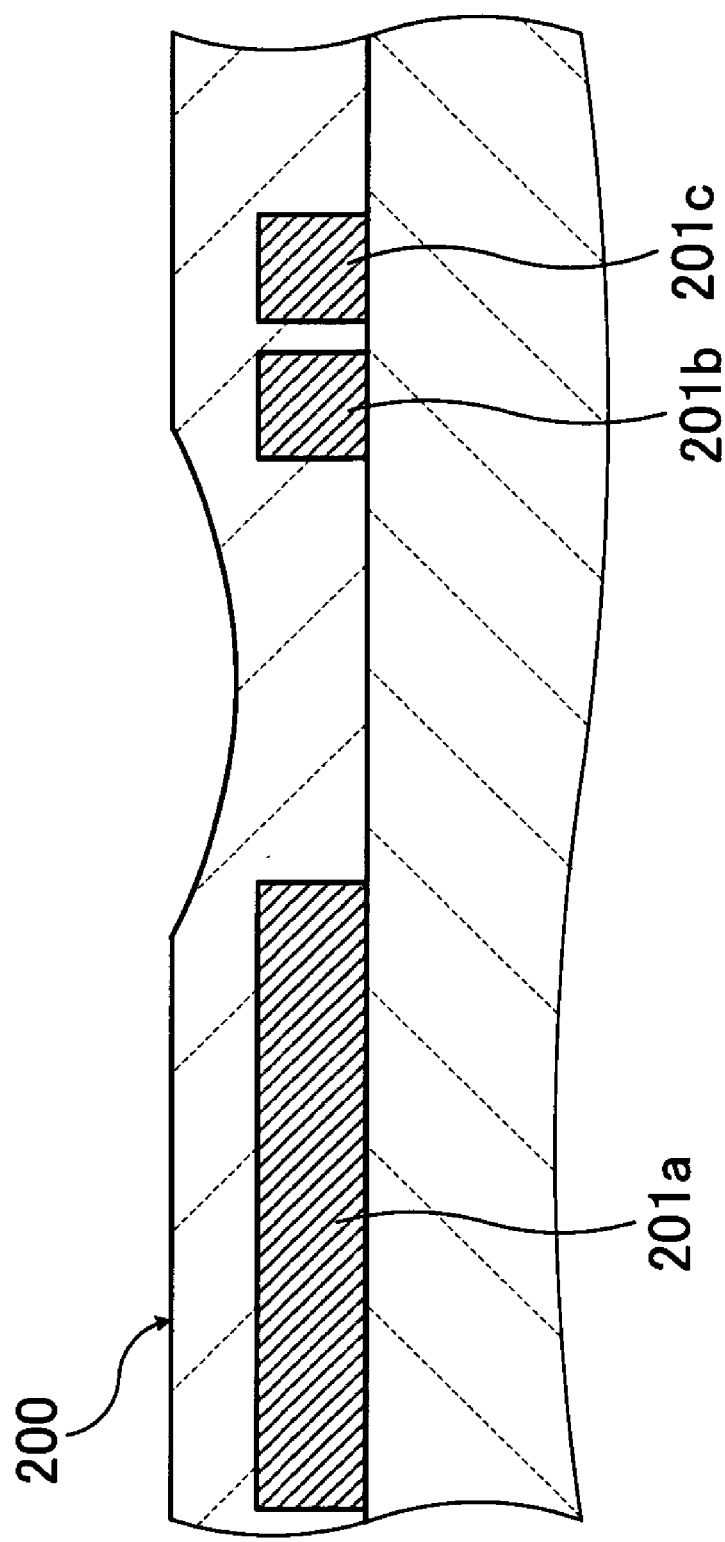
FIG. 16 shows an example of a wafer shape after polishing (part one).
Figure 17:
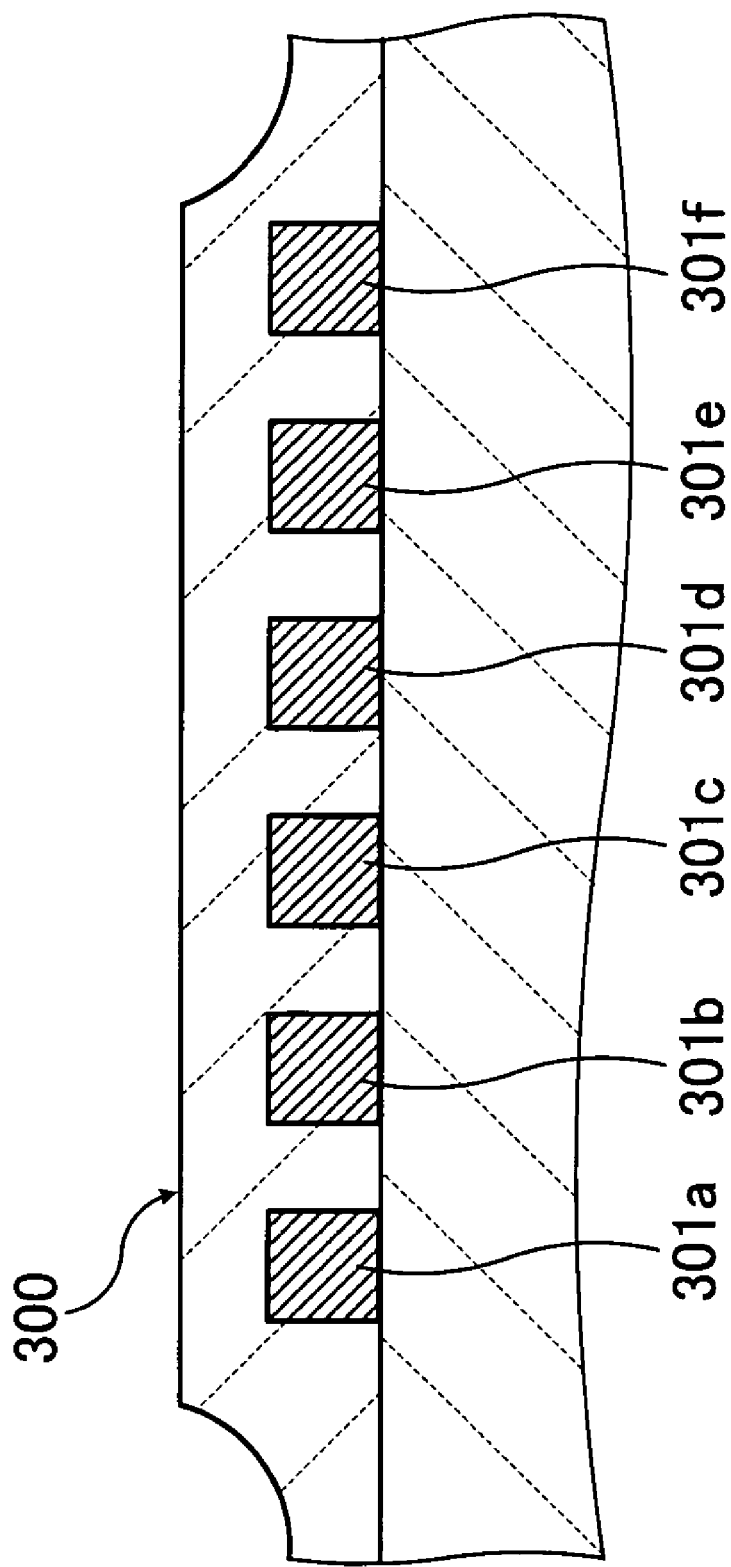
FIG. 17 shows an example of a wafer shape after polishing (part two).

Further, FIG. 14 is a schematic outline view of a second modification example of the polishing member. FIG. 14 schematically shows a cross section of one needle member.

In the polishing member shown in FIG. 14, a needle member 80 thereof has a structure that a sphere 80b is attached rotatably to a tip of an ultrafine tube 80a. In this respect, the polishing member shown in FIG. 14 differs from the polishing member 30. This needle member 80 allows the tube 80a to flow a working fluid 90 containing no abrasive grains. When the needle member 80 is pressed against the wafer 10 and is caused to rapidly vibrate, the working fluid 90 within the tube 80a is supplied to the wafer 10 surface through the sphere 80b which rotates along with vibration. The operational control of this polishing member during the polishing of the wafer 10 can be performed in the same manner as in the case of the polishing member 30. Also by using the polishing member having the needle member 80 with such a structure, the wafer 10 with high flatness can be obtained in the same manner as in the polishing member 30.

Further, a third modification example will be described. Depending on the structure of the needle member provided on the polishing member, a pressure sensor may be attached to each of the needle members to allow a pressure to be applied to each of the needle members. By adopting such a structure, highly accurate polishing can be performed on a minuter area.

As described above, when a wafer surface is polished using the above-described polishing member as well as using a working fluid containing no abrasive grains, an influence of pattern shapes or of film formation distribution within a wafer is suppressed and further, a scratch on the wafer surface is prevented from occurring so that a wafer with high flatness can be obtained. As a result, a high reliability semiconductor device can be manufactured. Further, on this occasion, the film formation amount of a film to be polished and the polished amount thereof can be reduced.

In the above description, a case of using a wafer as a workpiece is described by way of example; however, the polishing device having the above-described structure and the polishing method can be similarly applied also to other workpieces.

In the present invention, a polishing member having a needle member is used to polish a workpiece surface by bringing the needle member into contact with the workpiece surface and causing the needle member to vibrate. Therefore, a dishing due to asperities on the workpiece surface or a scratch extending over a wide range is prevented from occurring, so that the workpiece can be flattened with high accuracy.

When the polishing device and polishing method for performing the polishing are applied to the polishing of the wafer, the wafer with high flatness can be obtained. Therefore, breaking of wire, insulation failure, fluctuation of the resist coating film thickness or focus deviation of a lens during exposure can be prevented from occurring. As a result, a high reliability semiconductor device can be manufactured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A polishing device for polishing a workpiece surface, comprising:
   a polishing member is constructed by a plurality of blocks having a needle member, wherein
   polishing of the workpiece surface is performed by bringing the needle member into contact with the workpiece surface and causing the needle member to vibrate,
   wherein:
   the blocks are connected such that when the polishing member is disposed to face the workpiece surface, the needle member is disposed on the workpiece surface side; and
   the blocks are constructed freely movably such that each position of the blocks in the direction being separated from and brought into contact with the workpiece surface adjustable in a state where the blocks are connected,
   wherein each of the blocks has a working fluid supplying port for supplying to the workpiece surface a working fluid which reacts with the workpiece surface.

2. The polishing device according to claim 1, wherein the polishing is performed while supplying a working fluid which reacts with the workpiece surface to the workpiece surface.

3. The polishing device according to claim 2, wherein the working fluid contains no abrasive grains.

4. The polishing device according to claim 1, wherein the polishing member is disposed such that the needle member faces the workpiece surface, and is caused to vibrate in the direction almost parallel to the workpiece surface.

5. The polishing device according to claim 1, wherein the blocks are constructed such that each pressing force of the blocks against the workpiece surface can be controlled.

6. The polishing device according to claim 1, further comprising a holding section for fixing and holding the workpiece.

7. The polishing device according to claim 1, wherein the needle member is made of carbon nanotubes.

8. The polishing device according to claim 1, wherein a tip of the needle member is formed into a spherical shape.

9. The polishing device according to claim 1, wherein the needle member has a tube capable of flowing a working fluid which reacts with the workpiece surface to the workpiece surface, and a sphere rotatably provided on a tip of the tube.

10. The polishing device according to claim 1, wherein the workpiece is fixed when the polishing is performed.

11. A polishing method for polishing a workpiece surface, comprising:
    polishing, using a polishing member having a needle member, the workpiece surface by bringing the needle member into contact with the workpiece surface and causing the needle member to vibrate,
    wherein:
    the polishing member is constructed by connecting a plurality of blocks having the needle member; and
    each position of the blocks in the direction being separated from and brought into contact with the workpiece surface is adjusted to perform the polishing on an area to be polished,
    wherein the needle member is made of carbon nanotubes.

12. The method according to claim 11, wherein the polishing is performed while supplying a working fluid which reacts with the workpiece surface to the workpiece surface.

13. The method according to claim 12, wherein the working fluid contains no abrasive grains.

14. The method according to claim 11, wherein the polishing is performed by causing the needle member to vibrate in the direction almost parallel to the workpiece surface.

15. The method according to claim 11, wherein:
    the polishing member is constructed by connecting a plurality of blocks having the needle member; and
    each pressing force of the blocks against the workpiece surface is controlled to perform the polishing on an area to be polished.

16. The method according to claim 11, wherein the polishing is performed by fixing the workpiece.

* * * * *